(12) United States Patent
Ferrari et al.

(10) Patent No.: US 6,472,257 B2
(45) Date of Patent: Oct. 29, 2002

(54) HIGH QUALITY FACTOR, INTEGRATED INDUCTOR AND PRODUCTION METHOD THEREOF

(75) Inventors: Paolo Ferrari, Gallarate; Armando Manfredi, Corsico; Benedetto Vigna, Potenza, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/952,625

(22) Filed: Sep. 13, 2001

(65) Prior Publication Data

US 2002/0011653 A1 Jan. 31, 2002

Related U.S. Application Data

(62) Division of application No. 09/170,914, filed on Oct. 13, 1998.

(30) Foreign Application Priority Data

Oct. 23, 1997 (EP) .............................. 97830536

(51) Int. Cl.[7] .............................................. H01L 21/20
(52) U.S. Cl. ...................... 438/171; 438/190; 438/238; 438/329; 438/381; 438/421
(58) Field of Search ................. 438/171, 190, 438/238, 329, 381, 421; 257/379, 516, 528, 904, 277, 531

(56) References Cited

U.S. PATENT DOCUMENTS

| | | | | | |
|---|---|---|---|---|---|
| 4,262,399 A | * | 4/1981 | Cady | ........................ | 29/25.42 |
| 5,162,258 A | * | 11/1992 | Lemnios et al. | ............ | 437/184 |
| 5,227,658 A | * | 7/1993 | Beyer et al. | ................ | 257/522 |
| 5,306,659 A | * | 4/1994 | Beyer et al. | ................ | 437/64 |
| 5,427,975 A | * | 6/1995 | Sparks et al. | ................. | 437/79 |
| 5,429,993 A | * | 7/1995 | Beitman | ..................... | 437/228 |
| 5,438,015 A | * | 8/1995 | Lur | .............................. | 437/62 |
| 5,450,263 A | | 9/1995 | Desaigoudar et al. | ....... | 360/110 |
| 5,539,241 A | | 7/1996 | Abidi et al. | ................. | 257/531 |
| 5,682,053 A | * | 10/1997 | Wiszniewski | ............... | 257/401 |
| 5,825,092 A | | 10/1998 | Delgado et al. | ............ | 257/778 |
| 5,872,489 A | * | 2/1999 | Chang et al. | ............... | 331/179 |
| 6,197,655 B1 | * | 3/2001 | Montanini et al. | ......... | 438/411 |
| 6,211,056 B1 | | 4/2001 | Begley et al. | .............. | 438/619 |
| 6,383,889 B2 | * | 5/2002 | Yoshida | ..................... | 438/411 |
| 2001/0045617 A1 | * | 11/2001 | Xu et al. | .................... | 257/531 |

FOREIGN PATENT DOCUMENTS

| | | |
|---|---|---|
| EP | 0413348 A2 | 2/1991 |
| EP | 0812016 A1 | 12/1997 |
| WO | WO94/17558 | 8/1994 |

OTHER PUBLICATIONS

Kim et al. Surface Micromachined Solenoid Inductors for High Frequency Applications. Jan., 1998. IEEE Transactions on Components. Packaging, and Manufacturing Technology—Part C, vol. 21. pp. 26–33.*

* cited by examiner

Primary Examiner—Steven Loke
Assistant Examiner—Douglas W. Owens
(74) Attorney, Agent, or Firm—Lisa K. Jorgenson; Robert Iannucci; Seed IP Law Group PLLC

(57) ABSTRACT

The integrated inductor comprises a coil of metal which is formed in the second metal level. The coil is supported by a bracket extending above spaced from a semiconductor material body by an air gap obtained by removing a sacrificial region formed in the first metal level. The bracket is carried by the semiconductor material body through support regions which are arranged peripherally on the bracket and are separated from one another by through apertures which are connected to the air gap. A thick oxide region extends above the semiconductor material body, below the air gap, to reduce the capacitive coupling between the inductor and the semiconductor material body. The inductor thus has a high quality factor, and is produced by a process compatible with present microelectronics processes.

20 Claims, 5 Drawing Sheets

HIGH QUALITY FACTOR, INTEGRATED INDUCTOR AND PRODUCTION METHOD THEREOF

CROSS-REFERENCE TO RELATED APPLICATION

This application is a Divisional of pending U.S. patent application Ser. No. 09/170,914, filed Oct. 13, 1998, in the names of the inventors of the present invention.

TECHNICAL FIELD

The present invention relates to a high quality factor, integrated inductor and a production method thereof.

BACKGROUND OF THE INVENTION

As is known, inductors are key components of the operating blocks of a radio-frequency circuit. Their critical parameters comprise the inductance value L, the quality factor Q, and the resonance frequency f. Many applications, such as GSM cellular communications systems, require inductors which have inductance L of 1–10 nH, a quality factor Q of at least 10, and a resonance frequency which is far greater than 1 GHz.

Integrated inductors made of aluminum, which have a quality factor Q of 3, can easily be produced by means of standard microelectronics processes. The quality factor Q is however limited by the parasitic capacitance towards the substrate, and by the resistance of the inductor itself. Consequently, it is not possible at present to produce integrated inductors of semiconductor material which have a high quality factor. For applications which have high requirements, discrete inductors external to the integrated silicon device are used.

SUMMARY OF THE INVENTION

An object of the invention is thus to provide an inductor which has a high quality factor.

The present invention provides a high quality factor integrated inductor and production method thereof. In one embodiment of the present invention, the integrated inductor comprises a coil of conductive material wherein said coil is supported by a bracket extending above and spaced from a semiconductor material body by an air gap. The bracket is carried by the semiconductor material body through support regions.

To enable the present invention to be understood, a preferred embodiment is now described, purely by way of non-limiting example, with reference to the attached drawings.

DETAILED DESCRIPTION OF THE INVENTION

Figure 1:
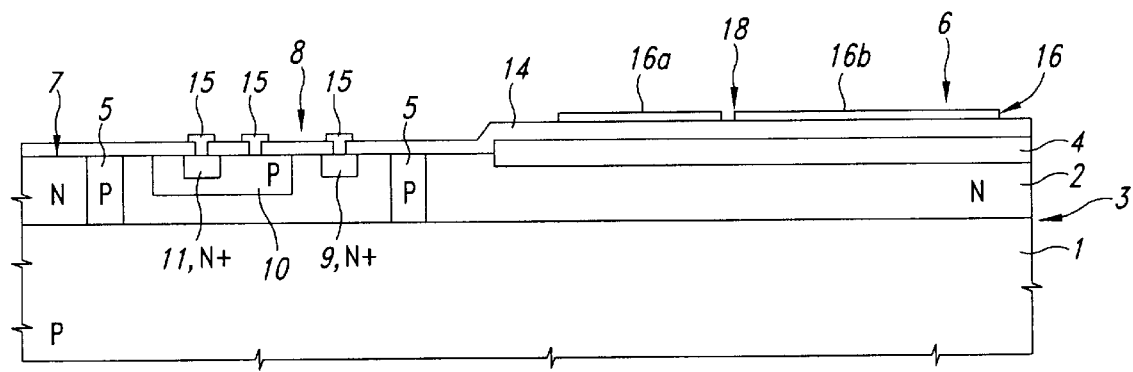
FIG. 1 is a transverse cross-section through a wafer of semiconductor material, in a first production step of the present inductor.

The present production method allows integration of an inductor to form an integrated electronic device of semiconductor material (e.g., silicon) which has electronic components of the MOS or bipolar type. The method begins with production steps known for forming electronic components. Referring to FIG. 1, on a substrate 1 of P-type, an epitaxial layer 2 of N-type is grown, obtaining a semiconductor material wafer 3; across a surface 7 of the epitaxial layer, thick field oxide regions are formed in order to delimit the active areas; in particular, a thick oxide region 4 extends in the area on which the inductor will be formed (inductor area 6). Then, in the epitaxial layer 2, junction isolation regions 5 of P-type are formed, extending from the surface 7 of the epitaxial layer 2 to the substrate 1, and in the epitaxial layer 2, conductive regions necessary for forming electronic components are formed. In particular, FIG. 1 shows an NPN transistor 8, having a collector contact region 9 of $N^+$-type, a base region 10 of P-type, and an emitter region 11 of N+-type.

Figure 2:
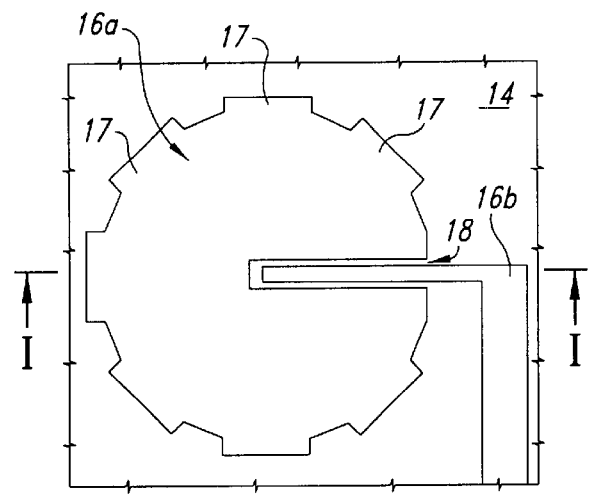
FIG. 2 is a view from above of part of the wafer in FIG. 1.

Subsequently, on the surface 7 of the epitaxial layer, a surface dielectric layer 14 (for example BPSG, Boron Phosphorous Silicon Glass) is deposited, and contacts are opened by means of a masking and selective removing step. Then, a first metal layer is deposited and defined, comprising for example aluminum-silicon, or aluminum-silicon-copper; thereby contact electrodes 15 for the components, and, in the inductor area 6, a sacrificial region 16a and a first connection line 16b are formed, region 16a and line 16b extending above the thick oxide region 4. Thus, the intermediate structure of FIG. 1 is obtained, wherein the sacrificial region 16a has an approximately polygonal shape with a plurality of peripheral extensions 17, providing the sacrificial region 16a with the shape of a "toothed wheel", as can be seen in the view from above in FIG. 2, relative to the inductor area 6 alone. As can be seen in FIG. 2, the sacrificial region 16a has a slot 18 which extends radially, and inside which there extends part of the first connection line 16b, which is spaced from the sacrificial region 16a.

Figure 3:
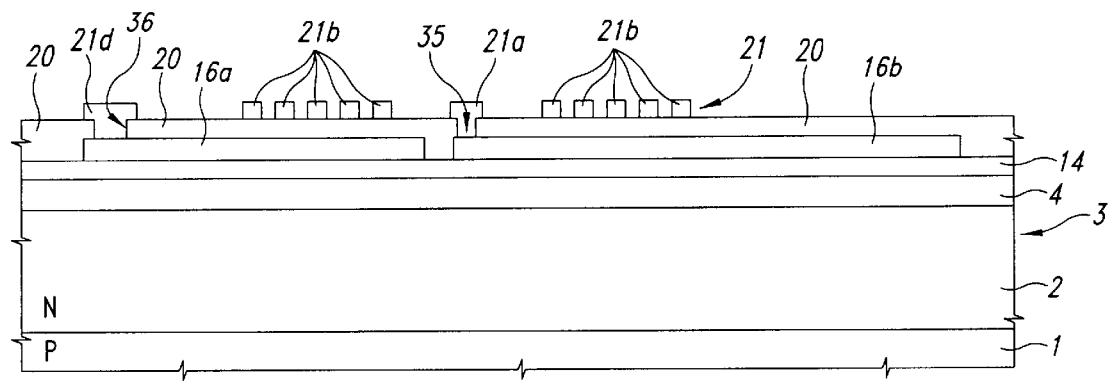
FIG. 3 is a transverse cross-section of the wafer in FIG. 1 in the inductor area and on an enlarged scale, in a subsequent production step.

Then an intermediate dielectric layer 20 (FIG. 3) is deposited and removed from the areas of the peripheral extensions 17, from the end of the first connection line 16b which is in the center of the sacrificial region 16a, and from the connection vias for the electrical components (not shown). In particular, at the end of the first connection line 16b, the intermediate dielectric layer 20 forms an aperture 35, and at the peripheral extensions 17 it forms apertures 36.

A second metal layer 21 of Al-Si or Al-Si-Cu or Cu is then deposited. In particular for Al- Si or Al-Si-Cu, this second metal layer 21 is deposited by sputtering, whereas for copper, it is grown electrolytically. The second metal layer 21 is in direct contact with the first metal layer 16, in the areas in which the intermediate dielectric layer 20 has been removed, in particular at the apertures 36, the aperture 35, and where the vias (not shown) have been formed.

Figure 4:
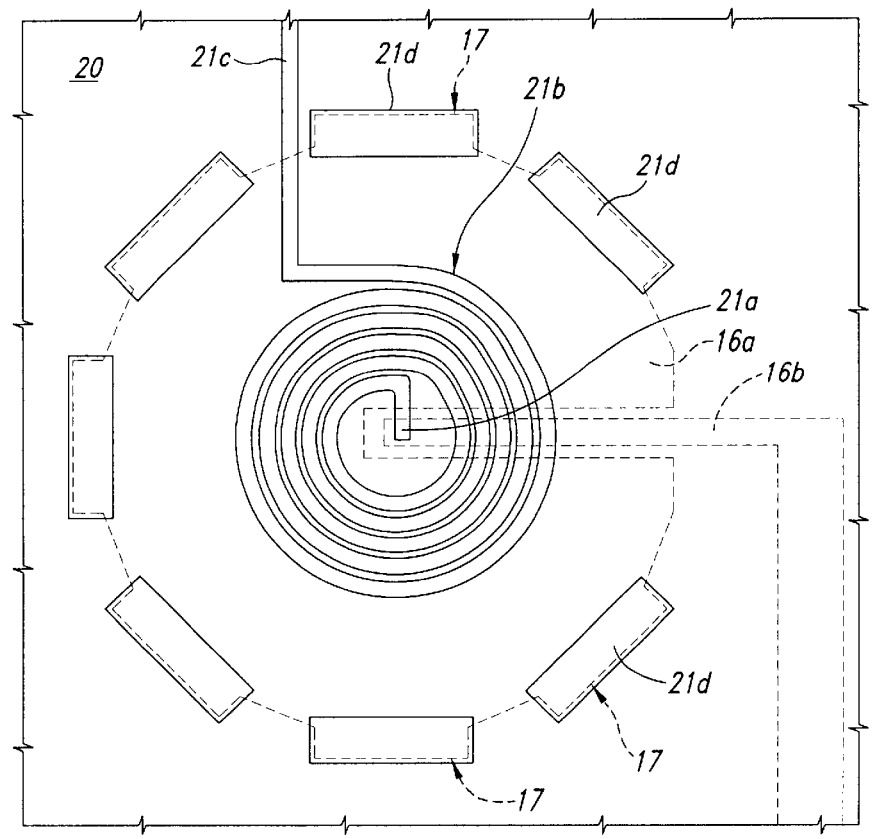
FIG. 4 is a see-through view from above of the wafer in FIG. 3.

Subsequently, the second metal layer 21 is shaped, and forms a contact region 21a extending inside the aperture 35; a coil 21b of the inductor extending, spiral-shaped, above the intermediate dielectric layer 20, from the contact region 21a towards the exterior; and a second connection line 21c extending without interruption from the coil 21b, as shown in FIG. 4, in which broken lines also represent the sacrificial region 16a and the first connection line 16b. In this step, in the apertures 36, etch regions 21d are formed, which are approximately in the shape of "plugs", providing the structure in FIG. 3; in addition (in a known and therefore not shown manner), a second electrical connection level of the circuit is formed.

Figure 5:
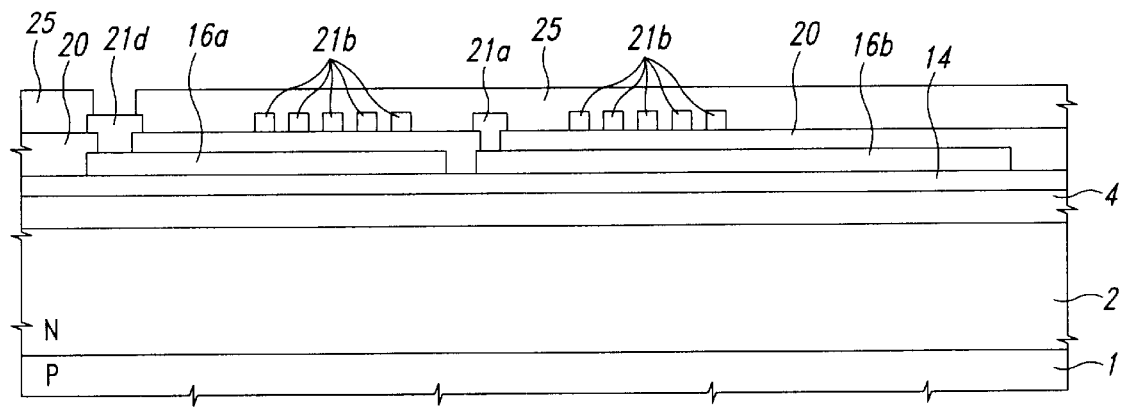
FIG. 5 is a cross-section similar to FIG. 3, in a subsequent step.
Figure 6:
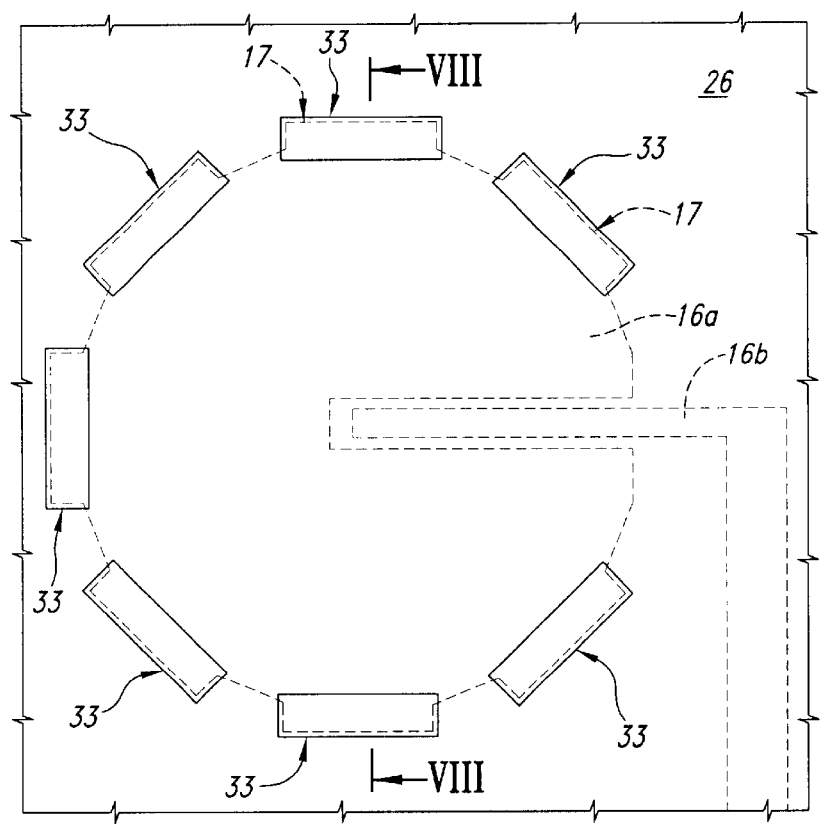
FIG. 6 is a see-through view from above of the wafer in FIG. 5.
Figure 7:
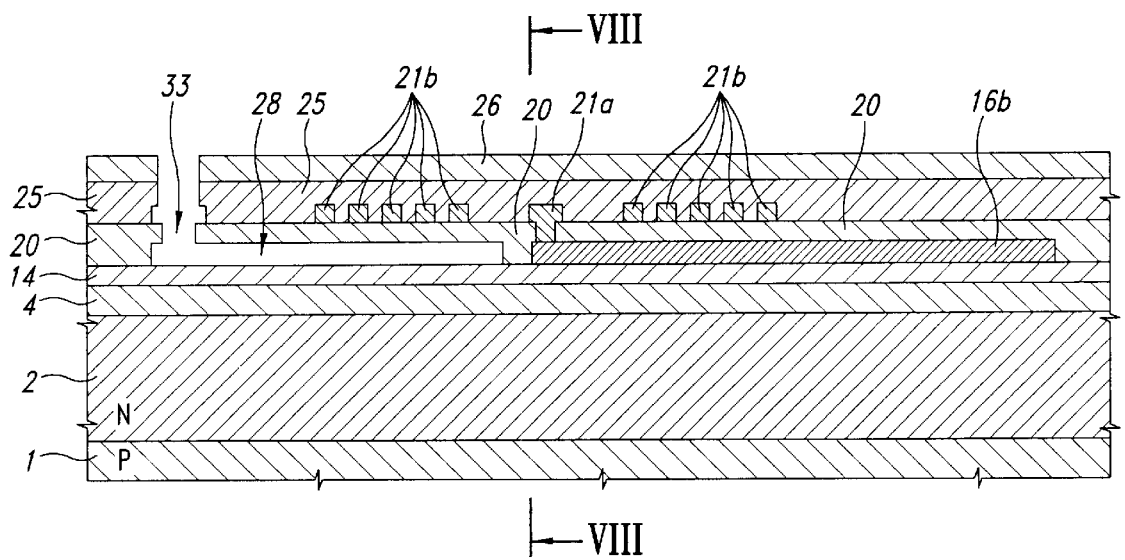
FIG. 7 is a cross-section similar to that in FIGS. 3 and 5, in a subsequent step.

Subsequently a passivation layer 25 of dielectric material is deposited and removed selectively at contact pads (not shown) of the circuit and at the etch regions 21d, which remain uncovered, as shown in FIG. 5. Then a protective layer 26, for example TEOS (tetraethylorthosilicate), with a thickness of 2000 A is deposited and removed at the etch regions 21d, forming apertures 33 which extend through the protective layer 26 and the passivation layer 25, as shown in FIG. 6, in which the sacrificial region 16a and the first connection line 16b are again represented by a broken line. The metal regions are then wet etched through the apertures 33; thus removing all the etch regions 21d and the sacrificial region 16a below the intermediate dielectric layer 20. Then the structure of FIG. 7 is obtained, the Figure showing an air gap 28, the shape of which corresponds exactly to the above-described sacrificial region 16a which is shown in FIG. 2. At this stage, the protective layer 26 protects the passivation layer 25 against etching.

Figure 8:
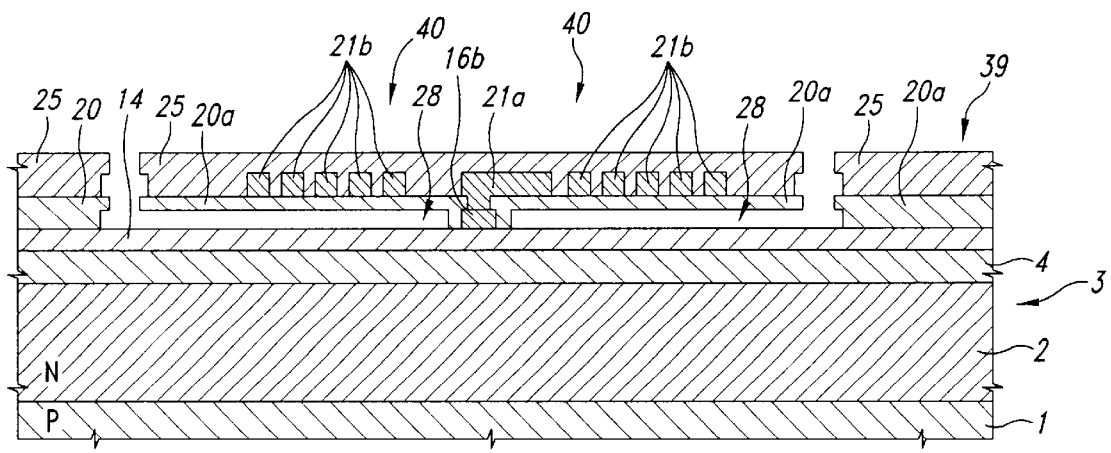
FIG. 8 is a transverse cross-section of the device at the end of production, seen along the cross-sectional plane VII-I–VIII in FIG. 7.
Figure 9:
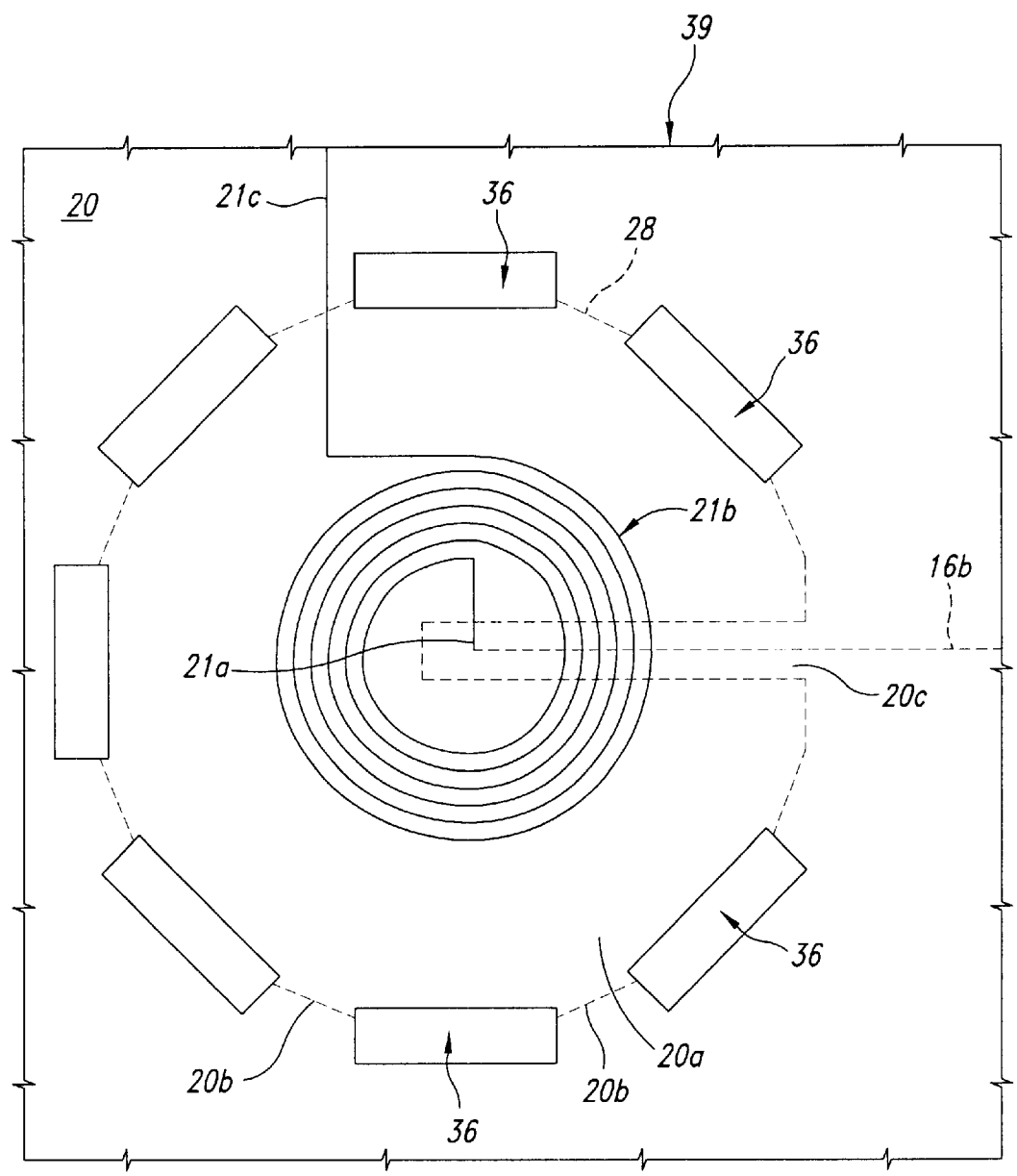
FIG. 9 is a view from above of the device in FIG. 8, with layers removed.

Finally, the protective layer 26 is removed from the entire surface (blanket removal). Then the final structure of FIG. 8 is obtained, wherein the coil (indicated at 40) of the inductor is carried by a bracket 20a formed from the intermediate dielectric layer 20, and is supported at the areas 20b which are delimited laterally by the apertures 36, as can be seen in FIG. 9, which shows a schematic view from above and on a reduced scale of the finished device, wherein the passivation layer 25 has been omitted and the periphery of the air gap 28 and the first connection line 16b are indicated by a broken line. As can be seen, the bracket 20a is also in contact with the wafer 3 at the narrow strip which surrounds the first connection line 16b (above the slot 18, and indicated as a portion of electrical isolation 20c).

This provides an integrated device 39, which comprises an integrated inductor 40, in addition to integrated electronic components such as the transistor 8. The integrated inductor 40 has a high quality factor, owing to the presence of an air gap, indicated at 28 in FIGS. 7 and 8, between the bracket 20a and the surface dielectric layer 14, and to the presence of a thick field oxide layer 4, which further reduces the coupling of the inductor and the substrate.

The production method described is compatible with the usual production processes used in the microelectronics industry, and thus has the advantages of reliability, controllability and repeatability which are typical of these processes. It requires only an additional mask for shaping the protective layer 26, compared with the standard processes with two metal levels, since the first metal level is also used to form the sacrificial region, and the second metal level is used to form the inductor; it therefore has costs which are comparable with, or only slightly higher than those of the standard processes.

Finally, it will be appreciated that many modifications and variants can be made to the inductor and the production process described and illustrated here, all of which come within the scope of the inventive context as defined in the attached claims.

What is claimed is:

1. A method for production of an integrated inductor, comprising:
    forming a sacrificial region on a semiconductor material body;
    forming a connection line on the semiconductor material body;
    forming a support region on said sacrificial region and said connection line, including a central portion of said support region extending through said sacrificial region toward said semiconductor material body;
    forming an inductor component on said support region, said inductor component being coupled at a central region thereof to said connection line;
    forming, laterally to said inductor component, apertures extending as far as said sacrificial region; and
    removing said sacrificial region through said apertures.

2. The method according to claim 1 wherein the connection line is formed by depositing a metal layer on said semiconductor material body and shaping said metal layer to form a connection line portion isolated from said sacrificial region and extending from a central portion of said sacrificial region toward a peripheral portion thereof.

3. The method according to claim 1 wherein forming a support region comprises depositing an intermediate dielectric layer and removing selective portions of said intermediate dielectric layer.

4. The method according to claim 1 wherein forming an inductor component comprises depositing a metal layer on said support region and shaping said metal layer, thereby forming a spiral structure.

5. The method according to claim 4, further comprising before forming the inductor component, forming first apertures laterally to said support region, wherein depositing a metal layer includes depositing portions of the metal layer in the first apertures; and
    wherein forming apertures comprises:
        depositing a protective layer on said inductor component;
        selectively removing portions of said protective layer laterally to the inductor component, to form second apertures;
        selectively removing the portions of said second metal layer from said first apertures, said first and second apertures forming said apertures.

6. The method according to claim 1 including simultaneously with forming said inductor component, forming etch regions of metal in a peripheral area of said support region and in direct contact with said sacrificial region, and wherein forming apertures comprises removing said etch regions.

7. The method according to claim 6 wherein removing the etch regions and removing the sacrificial region are carried out in a single wet etching step.

8. The method according to claim 1 further comprising before forming a sacrificial region, forming a field oxide region on said semiconductor material body.

9. The method according to claim 1 further comprising before forming a sacrificial region, integrating electric components in said semiconductor material body.

10. A method for manufacturing a semiconductor device having an integrated inductor, the method comprising:
    forming a dielectric layer on a semiconductor material body;

forming a sacrificial region and an electrical connection line on said dielectric layer, said electrical connection line extending from a central portion of said sacrificial region toward a peripheral portion thereof, forming a support region of dielectric material on said sacrificial region and said electrical connection line;

forming an electrically conductive coil on said support region and coupled at a central portion thereof to said electrical connection line;

forming apertures peripherally and separated from each other on said support region and extending as far as said sacrificial region; and removing said sacrificial region through said apertures to form an air gap under the support region.

11. The method of claim 10 wherein forming a dielectric layer comprises:

forming a field oxide layer over said semiconductor material body; and forming a silicate glass layer over said field oxide layer.

12. The method of claim 10 wherein forming said sacrificial region and said connection line comprises depositing a first metal layer, and forming said coil comprises depositing a second metal layer.

13. The method of claim 10 wherein forming a support region of dielectric material on said sacrificial region includes forming a central portion of said dielectric material extending between said support region and said semiconductor material body.

14. The method of claim 10 wherein forming a support region of dielectric material on said sacrificial region and said electrical connection line includes forming a portion of said dielectric material extending between said support region and said semiconductor material body over said electrical connection line.

15. A method for producing an integrated circuit, the method comprising:

forming on a surface of a semiconductor material body a first metal layer and defining therein a sacrificial region having a slot extending from a central portion of the sacrificial region toward a peripheral portion thereof and a connection line formed within the slot;

depositing an first dielectric layer over the sacrificial region, the slot and the connection line, the first dielectric layer being shaped to form a central aperture at the central portion of the sacrificial region adjacent to an end of the connection line and peripheral apertures at peripheral portions of the sacrificial region;

depositing a second metal layer over the first dielectric layer and in contact with the first metal layer at the central aperture, the second metal layer shaped to form an inductor extending from the central aperture toward a lateral support portion between the peripheral apertures; and removing the sacrificial region through the peripheral apertures.

16. The method recited in claim 15 further comprising:

depositing a second dielectric layer over the second metal layer; and shaping the second dielectric layer to form etch regions therein over the peripheral apertures.

17. The method recited in claim 15 wherein depositing a second metal layer over the first dielectric layer and in contact with the first metal layer at the central aperture includes depositing the second metal layer in contact with the first metal layer at the peripheral apertures.

18. The method recited in claim 15 wherein removing the sacrificial region through the peripheral apertures includes performing a wet etch of the sacrificial region below the first dielectric layer.

19. The method recited in claim 15 wherein depositing a second metal layer shaped to form an inductor extending from the central aperture toward a lateral support portion between the peripheral apertures includes shaping the second metal layer to form a spiral inductor extending from the central aperture outward toward the peripheral apertures.

20. The method recited in claim 15 wherein removing the sacrificial region through the peripheral apertures includes forming an air gap below a bracket portion of the first dielectric layer supported by a plurality of lateral supports delimited by the peripheral apertures and by a radial support portion formed through the air gap between the bracket portion and the semiconductor material body delimited by the slot.

* * * * *